(12) United States Patent
Chiang et al.

(10) Patent No.: US 11,967,375 B2
(45) Date of Patent: *Apr. 23, 2024

(54) MEMORY CELL WITH BUILT-IN AMPLIFYING FUNCTION, MEMORY DEVICE AND METHOD USING THE SAME

(71) Applicant: Taiwan Semiconductor Manufacturing Company, Ltd., Hsinchu (TW)

(72) Inventors: Hung-Li Chiang, Taipei (TW); Chao-Ching Cheng, Hsinchu (TW); Tzu-Chiang Chen, Hsinchu (TW); Yu-Sheng Chen, Taoyuan (TW); Hon-Sum Philip Wong, Stanford, CA (US)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 112 days.

This patent is subject to a terminal disclaimer.

(21) Appl. No.: 17/529,261

(22) Filed: Nov. 18, 2021

(65) Prior Publication Data

US 2022/0076741 A1 Mar. 10, 2022

Related U.S. Application Data

(63) Continuation of application No. 16/805,872, filed on Mar. 2, 2020, now Pat. No. 11,183,236.

(60) Provisional application No. 62/880,656, filed on Jul. 31, 2019.

(51) Int. Cl.
*G11C 11/00* (2006.01)
*G11C 13/00* (2006.01)
*H10B 63/00* (2023.01)

(52) U.S. Cl.
CPC .......... *G11C 13/003* (2013.01); *G11C 13/004* (2013.01); *H10B 63/24* (2023.02); *G11C 2213/15* (2013.01); *G11C 2213/72* (2013.01)

(58) Field of Classification Search
CPC . G11C 13/003; G11C 13/004; G11C 2213/15; G11C 13/0004; G11C 13/0028; G11C 2213/72; H10N 70/20; H10N 70/231; H10N 70/245; H10N 70/8265; H10N 70/8825; H10N 70/8828; H10N 70/8833; H10N 70/8836; H10N 70/884;
(Continued)

(56) References Cited

U.S. PATENT DOCUMENTS

2007/0211523 A1* 9/2007 Kim ................. G11C 11/16
365/158
2013/0001494 A1* 1/2013 Chen ................. H10N 70/24
257/1

(Continued)

*Primary Examiner* — Uyen Smet
(74) *Attorney, Agent, or Firm* — JCIPRNET

(57) ABSTRACT

A memory device that includes at least one memory cell is introduced. Each of the at least one memory cell is coupled to a bit line and a word line. Each of the at least one memory cell includes a memory element and a selector element, in which the memory element is configured to store data of the at least one memory cell. The selector element is coupled to the memory element in series and is configured to select the memory element for a read operation and amplify the data stored in the memory element in the read operation.

20 Claims, 3 Drawing Sheets

(58) Field of Classification Search
CPC .... H10N 70/841; H10N 70/881; H10B 63/24; H10B 61/10; H10B 63/80
See application file for complete search history.

(56) References Cited

U.S. PATENT DOCUMENTS

2019/0043923 A1* 2/2019 Ahmed .................. H10B 63/84
2020/0411589 A1* 12/2020 Wan ....................... H10B 63/24

* cited by examiner

MEMORY CELL WITH BUILT-IN AMPLIFYING FUNCTION, MEMORY DEVICE AND METHOD USING THE SAME

CROSS-REFERENCE TO RELATED APPLICATION

This application is a continuation application of and claims the priority benefit of a prior application Ser. No. 16/805,872, filed on Mar. 2, 2020, now allowed. The prior application claims the priority benefit of U.S. provisional application Ser. No. 62/880,656, filed on Jul. 31, 2019. The entirety of the above-mentioned patent application is hereby incorporated by reference herein and made a part of this specification.

BACKGROUND

Memory devices are used in a wide range of applications for storing data. Operations of the memory device such as the read and write operations are performed through bit lines and word lines being coupled to each memory cell of the memory device. However, the parasitic resistance existed in the bit lines, word lines and circuitry coupled to the memory cell may result in performance degradation of the memory device. For example, the parasitic resistance may decrease a margin between a first logic state and a second logic state of the memory cell, thereby increasing a risk of errors.

In a read operation, the parasitic resistance may decrease the read margin of the read operation performed at the memory cell, If the read margin left for a sense amplifier is not enough, a more complicated and large-in-size design may be needed for the sense amplifier.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DESCRIPTION OF THE EMBODIMENTS

Figure 1:
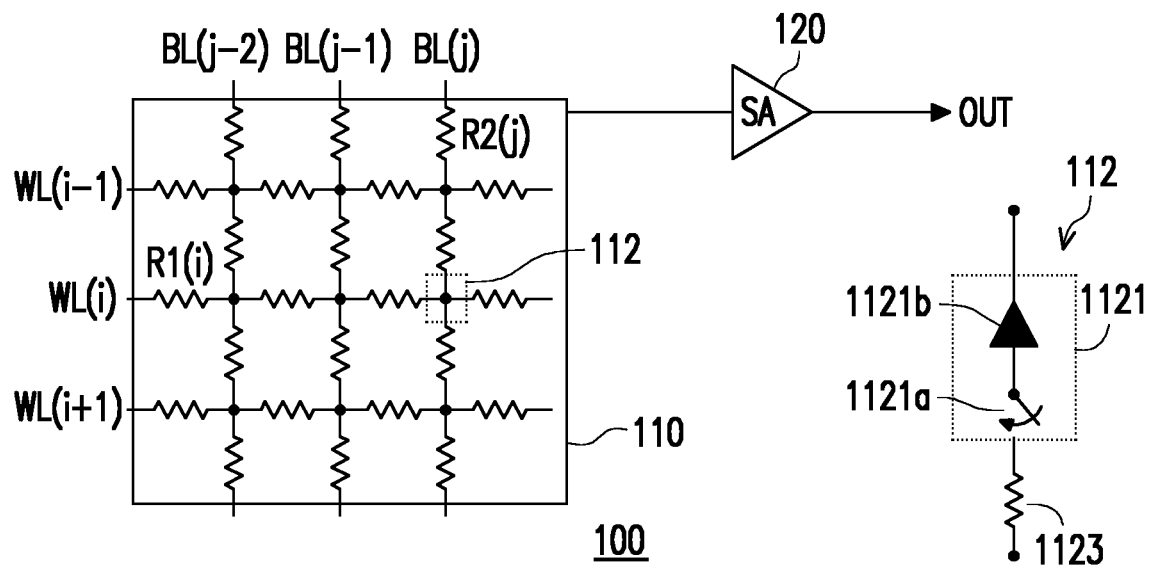
FIG. 1 is a schematic diagram of a memory device in accordance with some embodiments.

The following disclosure provides many different embodiments, or examples, for implementing different features of the present disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a schematic diagram of a memory device 100 in accordance with some embodiments. The memory device 100 may include a memory array 110 and a sense amplifier 120 that is coupled to the memory array 110. The memory array 110 may include a plurality of memory cells, in which each of the memory cells is coupled to a bit line among a plurality of bit lines BL(j−2) through BL(j) and a word line among a plurality of word lines WL(i−1) through WL(i+1). For example, the memory cell 112 is coupled to the bit line BL(j) and the word line WL(i), in which i and j are positive integers. FIG. 1 shows an array of three bit lines BL(j−2) through BL(j) and three word lines WL(i−1) through WL(i+1), but the numbers of word lines and bit lines in the memory array 110 are not limited thereto and are determined according to design needs.

In some embodiments, parasitic resistance is existed in the word lines, bit lines and peripheral circuit coupled to each memory cell of the memory array 110. As shown in FIG. 1, the word line WL(i) may include a parasitic resistance R1(i), and the bit line BL(j) may include a parasitic resistance R2(j). Because of the parasitic resistance, electrical signals, i.e., voltage or current signals, applied to the memory cell through the bit lines and the word lines may be influenced by the parasitic resistance. The parasitic resistance in the word lines, bit lines or a peripheral circuitry may cause a decrease of the margin between a first logic state and a second logic state stored in the memory cell. For example, the parasitic resistance of the bit lines and word lines may degrade a read margin of a read operation on the memory cell of the memory array 110.

In some embodiments, each of the memory cell may include a memory element and a selector element, in which the selector element is coupled to the memory element in series. For example, the memory cell 112 may include a selector element 1121 and memory element 1123, in which the selector element 1121 is coupled to the memory element 1123 in series. The memory element 1123 is configured to store data of the memory cell 112. The data stored in the memory element 1123 could be a single-bit data or multi-bit data that are determined based on the design needs. In some embodiments, the memory element 1123 may store a single-bit data, i.e., binary data, that may be in a first logic state or a second logic state. In some embodiments, the memory cell 112 is a resistive memory cell and the memory element stores either a high-resistive state or a low-resistive state. In some alternative embodiments, the memory cell 112 of the memory array 110 may be a resistive random access memory (RRAM) cell, a phase-change random access memory (PCRAM) cell, a ferroelectric random access memory (FRAM) cell, a magnetoresistive random access memory (MRAM) cell, a conductive-bridging random access memory (CBRAM), a non-volatile random access memory (NRAM) cell, or any memory cell that is compatible with nano-scale logic circuits. In some embodiments, the memory cell that has a contact poly pitch smaller than 100 nm is considered as a memory cell that is compatible with the nano-scale logic circuits, but the disclosure it not limited thereto.

In some embodiments, the selector element 1121 of the memory cell 112 has a switching function 1121a and an amplifying function 1121b. The switching function 1121a of the selector element 1121 is configured to select or deselect the memory element 1123 by switching on or off an electrical connection between the memory element 1123 and the bit line, i.e., BL(j), for a specific operation. For example, the selector element 1121 may select the memory cell 112 for a read operation or a write operation by switching on the electrical connection between the memory element 1123 of the memory cell 112 and a bit line (e.g., bit line BL(j)). In some embodiments, the selector element 112 receives a control signal, and perform the switching function 1121a based on the control signal to select the memory element 1123. In some embodiments, the selector element 112 has a control terminal that is electrically coupled to a word line (e.g., world line WL(i)) for receiving the control signal.

In some embodiments, the amplifying function 1121b is located inside the selector element 1121 is configured to amplify the data stored in the memory element 1123 of the memory cell 112 before outputting the amplified data to the bit line BL(j) being coupled to the memory cell 112. The amplifying function 1121b may be considered as a built-in amplifying function of the memory cell 112. In some embodiments, the data from the bit line, i.e., BL(j), may be further amplified by using an external amplifying function of a sense amplifier, in which the external amplifying function of the sense amplifier is different from the built-in amplifying function of the selector element 1121 of the memory cell 112.

In some embodiments, the amplifying function 1121b of the selector element 112 is obtained based on a property of the material that forms the selector element 1121. For example, the material of the selector element 1121 includes a negative resistance material that has a negative-resistance property. The negative-resistance property may include an inverse proportion between the voltage applied to the selector element 1121 and the current flowing through the selector element 1121. In other words, a voltage applied to the selector element 1121 decreases as the current flowing through the selector element 1121 increases.

In some embodiments, an operating voltage of the selector element 1121 is selected such that the selector element 1121 is switched on or off based on the logic state stored in the memory cell 112. For example, when the memory cell is a RRAM memory cell, the operating voltage of the selector element 1121 is selected such that the selector element 1121 is switched on when the memory cell 112 is in the low-resistive state and the selector element 1121 is switched off when the memory cell 112 is in the high-resistive state. In some embodiments, the selector element 1121 may be or may include an ovonic threshold switch (OTS) that has the negative-resistance property. The operating states (e.g., an ON state and an OFF state) of the OTS depends on a threshold voltage and a holding voltage of the OTS. In some embodiments, the operating voltage of the selector element 1121 is selected in a voltage range from the holding voltage to the threshold voltage of the OTS. When the operation voltage of the selector element 1121 is selected in the voltage range from the holding voltage to the threshold voltage of the OTS, the selector element 1121 is switched on when the memory cell 112 is in the low-resistive state and the selector element 1121 is switched off when the memory cell 112 is in the high-resistive state.

In some embodiments, the sense amplifier 120 is coupled to the memory array 110 and is configured to read data stored in at least one memory cell of the memory array 110 to output a read data OUT. In some embodiments, the sense amplifier 120 is electrically coupled to the bit lines BL(j−2) through BL(j) to read data stored in the at least one memory cell being coupled to the bit lines BL(j−2) through BL(j). For example, the sense amplifier 120 is coupled to the bit line BL(j) to read the data stored in the memory cell 112 of the memory array 110. In some embodiment, the selector element 1121 of the memory cell 112 is configured to perform the built-in amplifying function 1121b to generate amplified data before outputting the amplified data to the bit line BL(j). As such, the sense amplifier 120 receives the amplified data that are obtained by using the built-in amplifying function 1121b of the selector element 1121 through the bit line BL(j). When the amplified data generated by the built-in amplifying function 1121b is enough for the read operation, the sense amplifier 120 may not need to perform an external amplifying function, thereby saving computation cost. In some embodiments, the sense amplifier 120 may perform the external amplifying function to the amplified data received from the bit line BJ(j), thereby improve the effect of amplification.

Figure 2:
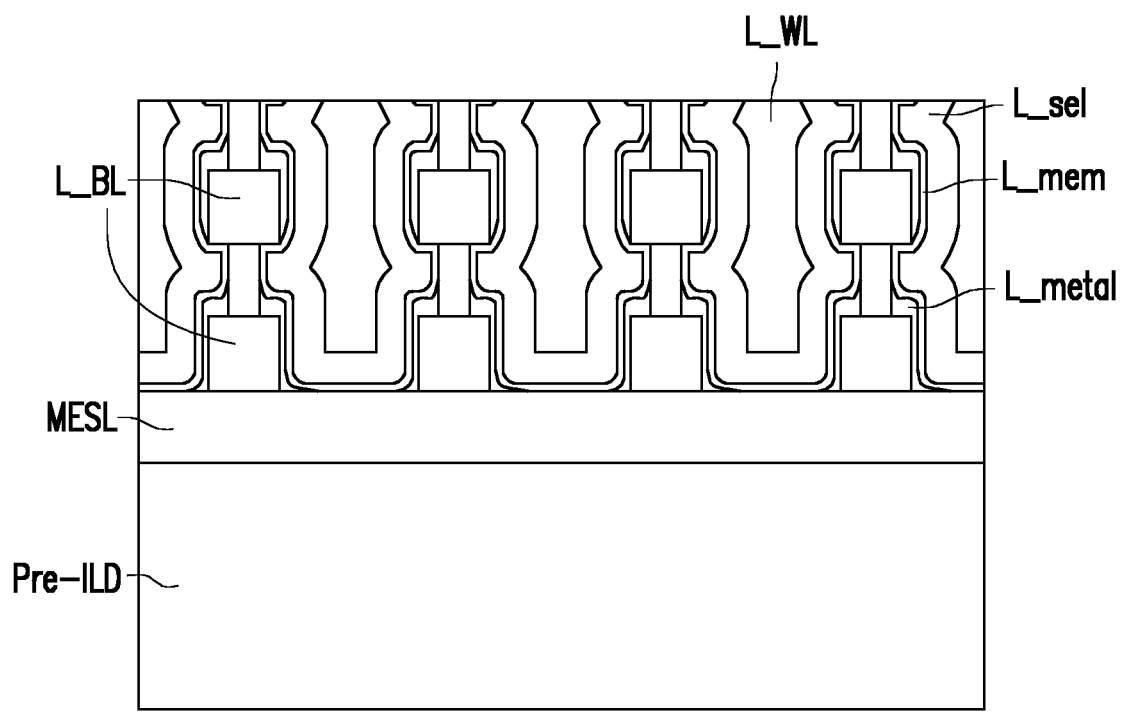
FIG. 2 illustrates a structure of memory cell in accordance with some embodiments.

FIG. 2 illustrates a structure of memory cells in accordance with some embodiments. The memory cells of the memory array 110 may be formed by stacking several layers. In some embodiments, the stacked layers of the memory cells include a metal pad layer L_metal, a memory element layer L_mem and a selector element layer L_sel. The positions of the metal pad layer L_metal, the memory element layer L_mem and the selector element layer L_sel may vary based on design needs. In some embodiments, the selector element layer L_sel is stacked on top of the metal pad layer L_metal, and the metal pad layer L_metal is stacked on top of the memory element layer L_mem. In some alternative embodiments, the memory element layer L_mem is stacked on top of the metal pad layer L_metal; and the metal pad layer L_metal is stacked on top of the selector element layer L_sel. In some alternative embodiments, the memory layer L_mem is sandwiched between the selector element layer L_sel and the metal pad layer L_metal.

In some embodiments, the structure of the memory cells may further include a metal word line layer L_WL and a metal bit line layer L_BL, in which the word lines of the memory array are disposed on the metal word line layer L_WL and the bit lines of the memory array are disposed on the metal bit line layer L_BL. In some embodiments, the bit line layer L_BL is located above the metal pad layer L_metal, the memory element layer L_mem and the selector element layer L_sel. In some embodiments, the metal word line layer L_WL is located under the metal pad layer L_metal, the memory element layer L_mem and the selector element layer L_sel. A stack of the memory layer L_mem, the selector element layer L_sel and the metal pad layer L_metal may be sandwiched between the metal word line layer L_WL and the metal bit line layer L_BL, in which the bit line layer L_BL may directly contact the metal pad layer L_metal, and the metal word line layer L_WL may directly contact the selector element layer L_sel. In some embodiments, the structure of the memory cells may further include a middle etch stop layer MESL and a dielectric layer Pre-ILD.

In some embodiments, the material of the selector element layer L_sel is a negative resistance material that includes amorphous semiconductor compounds, the amorphous semiconductor compound includes at least one of a binary compound, a ternary compound, a quadruple compound, and a quinary compound. In some embodiments, the binary compound includes at least one of SiTe, GeTe, CTe, BTe, ZnTe, AlTe, GeSe, GeSb, SeSb, SiAs, GeAs, AsTe, and BC. The binary compound(s) that forms the selector element layer L_sel may be doped using a nitrogen-containing doping (N-doping), an oxygen-containing doping (O-doping) or any other suitable doping technology. In some embodiments, the ternary compound includes at least one of GeSeAs, GeSeSb, GeSbTe, GeSiAs, GeAsSb, SeSbTe, and SiTeSe. The ternary compound(s) that forms the selector element layer L_sel may be doped using N-doping, O-doping, a carbon-containing doping (C-doping) or any other suitable doping technology. In some embodiments, the quadruple compound(s) includes at least one of GeSeAsTe, GeSeTeSi, GeSeTeAs, GeTeSiAs, GeSeAsSb, and GeSeSbSi. The quadruple compound(s) that forms the selector element layer L_sel may be doped using N-doping, O-doping, C-doping or any other suitable doping technology.

In some embodiments, the material of the memory element layer L_mem may vary based on the type of the memory cells in the memory array (e.g., memory array 110 in FIG. 1). In some embodiments, the memory cells of the memory array may be or may include the MRAM memory cells that are formed by a free layer, a tunneling barrier, a reference layer and a fixed layer. In some embodiments, the material of the free layer includes at least one of CoFe, CoFeB, CoFeBTa, CoFeTa, or any combination thereof. In some embodiments, the material of the free layer includes a stack of CoFe/Ta/CoFe, a stack of CoFe/Ta/CoFeB, a stack of CoFeB/Ta/CoFe, or a stack of CoFeB/Ta/CoFeB. In an example, the stack of CoFe/Ta/CoFe includes a layer of CoFe, a layer of Ta and another layer of CoFe being stacked in sequence. In some embodiments, the element tantalum (Ta) in the compound(s) of the free layer material may be replaced by tungsten (W) or ruthenium (Ru). In some embodiments, the material of the tunneling barrier of the memory element layer L_mem includes at least one compound of MgO and AlOx. Other materials that are suitable for the tunneling barrier may be used to form the tunneling barrier according to the design needs.

In some embodiments, the material of the reference layer of the memory element layer L_mem includes CoFe, CoFeB, CoFeBTa, or CoFeTa. In some embodiments, the material of the reference layer of the memory element layer L_mem includes a stack of CoFe/Ta/CoFe, a stack of CoFe/Ta/CoFeB, a stack of CoFeB/Ta/CoFe, or a stack of CoFeB/Ta/CoFeB. In some embodiments, the element tantalum (Ta) in the compound(s) of the reference layer material may be replaced by tungsten (W) or ruthenium (Ru). In some embodiments, the material of the fixed layer includes a stack of (Co/Pt)x/Ru/(Co/Pt)y, (Co/Pt)x/Ir/(Co/Pt)y, in which x and y are respectively within a range from 1 to 8.

In some embodiments, the memory cells of the memory array may be or may include the RRAM memory cells that are formed by a top electrode, a dielectric layer and a bottom electrode. In some embodiments, the material of the top electrode includes Ti, Ta, TiN, TaN, W, Ru, Zr, Pt, Al, Ni, or any combination thereof. In some embodiments, the material of the dielectric layer includes HfOx, TaOx, TiOx, ZrOx, NbOx, NiO, HfZrOx, HfTiOx, or any combination thereof. In some embodiments, the material of the bottom electrode includes Ti, Ta, TiN, TaN, W, Ru, Zr, Pt, Al, Ni, or any combination thereof.

In some embodiments, the memory cells of the memory array may be or may include the CBRAM memory cells that are formed by a top electrode and a dielectric layer. The material of the top electrode of the CBRAM memory cells may include Ag, Cu, AgTe, CuTe, or any combinations thereof. The material of the dielectric layer of the CBRAM memory cells may include HfOx, TaOx, TiOx, ZrOx, HfZrOx, HfTiOx, or any combinations thereof.

In some embodiments, the memory cells of the memory array may be or may include the PCRAM memory cells that are formed by a top electrode and a dielectric layer and a bottom electrode. The material of the top electrode of the PCRAM memory cells may include Ti, Ta, TiN, TaN, W, C, or any combinations thereof. The material of the dielectric layer of the PCRAM memory cells may include GeSbTe, GeTe, GeSb, SbTe, or any combinations thereof In some embodiments, the material of the dielectric layer of the PCRAM memory cells includes different composition ratios and include various dopant elements such as N, O, C, Si, In, $SiO_2$. The material of the bottom electrode of the PCRAM memory cells may include Ti, Ta, TiN, TaN, W, C, or any combination thereof.

Figure 3:
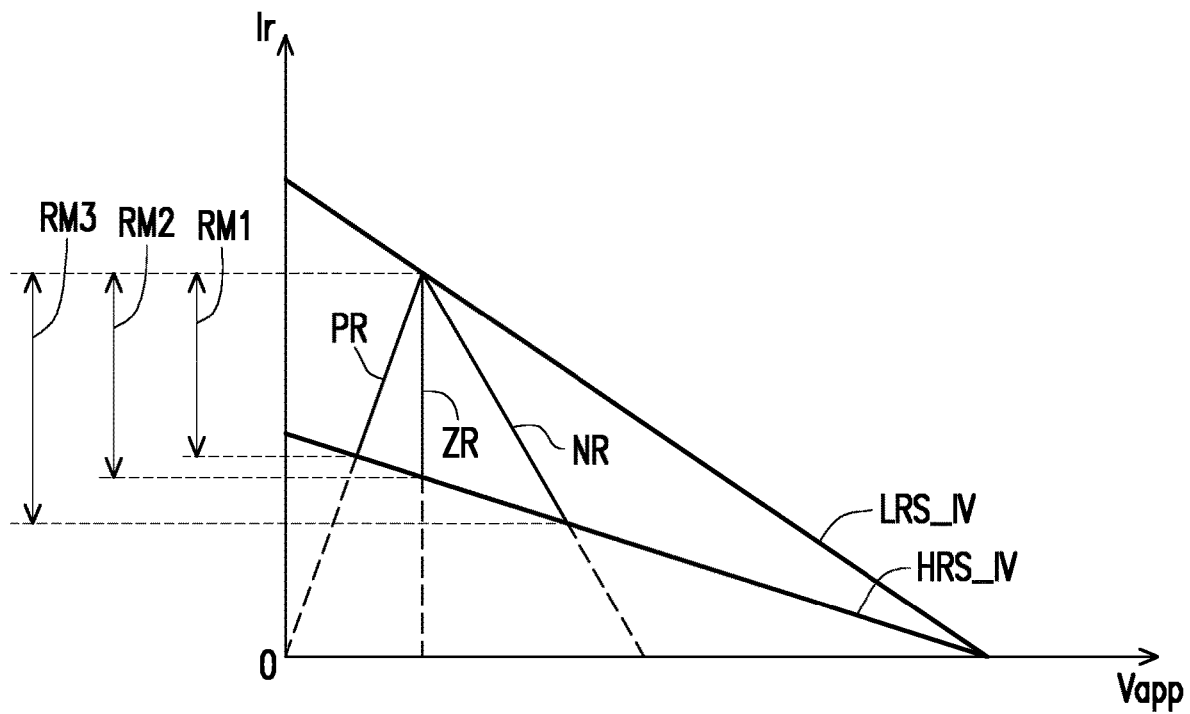
FIG. 3 illustrates current-voltage (IV) characteristics of a positive-resistance property, a zero-resistance property and a negative-resistance property in a memory cell in accordance with some embodiments.

FIG. 3 illustrates IV characteristics of a positive-resistance property, a zero-resistance property and a negative-resistance property in a memory cell in accordance with some embodiments. The horizontal axis as illustrated in FIG. 3 indicates a voltage that is applied to the memory cell, and the vertical axis as illustrated in FIG. 3 indicates a current flowing through the memory cell. The line PR represents the IV characteristic of the memory cell having the positive-resistance property. The line ZR represents the IV characteristic of the memory cell having the zero-resistance property. The line NR represents the IV characteristic of the memory cell having the negative-resistance property. In some embodiments, the positive-resistance property of the memory cell may include a direct proportion between the voltage Vapp across the memory cell and the current Ir flowing through the memory cell. In other words, if the memory cell has the positive-resistance property, the current Ir flowing through the memory cell increases as the voltage Vapp across the memory cells increases, and vice versa. The zero-resistance property of the memory cell may be the property in which the voltage Vapp across the memory cell remain relatively constant as the current Ir flowing through the memory increases or decreases. The negative-resistance property of the memory cell may include an inverse proportion between the voltage Vapp across the memory cell and the current Ir flowing through the memory cell. In other words, if the memory cell has the negative-resistance property, the current Ir flowing through the memory cell increases as the voltage Vapp across the memory cell decreases, and vice versa.

FIG. 3 further illustrates lines HRS_IV and LRS_IV for indicating IV characteristics of a high-resistive state and a low-resistive state of a memory cell, i.e., memory cell 112 in FIG. 1, in accordance with some embodiments. For a same voltage across the memory cell, the current measured from the memory cell having the high-resistive state is lower than the current measured from the memory cell having the low-resistive state. A difference between the current flowing through the memory cell having the low-resistance state and the current flowing through the memory cell having the high-resistance state may be used to determine the read margin of a read operation being performed on the memory cell. In some embodiments, the read margin must be large enough to ensure the correctness of the read operation to the memory cell.

FIG. 3 further illustrates the read margins RM1, RM2 and RM3 of the positive-resistance property, the zero-resistance property and the negative-resistance property in accordance with some embodiments. The read margins RM1, RM2 and RM3 may be determined according to a difference between the current flowing through the memory cell having the high-resistive state and the current flowing through the memory cell having the low-resistive state. As shown in FIG. 3, the read margin RM1 of the memory cell having the positive-resistance property is smaller than the read margin RM2 of the memory cell having the zero-resistance property. The read margin RM2 of the memory cell having the zero-resistance property is smaller than the read margin RM3 of the memory cell having the negative-resistance property. In other words, the memory cell having the negative-resistance property may have higher read margin in compared with the memory cells having the positive-resistance property and the zero-resistance property. As such, the negative-resistance property may improve the read margin of the memory cell in the read operation.

Referring to FIG. 1 and FIG. 3, the selector element 1121 of the memory cell 112 may be formed by the material that has the negative-resistance property. As such, the selector element 1121 of the memory cell 112 may have the IV characteristic that is represented by the line NR shown in FIG. 3. Accordingly, the read margin of the read operation performed on the memory cell 112 may be improved based on the negative-resistance property of the selector element 1121.

Figure 4:
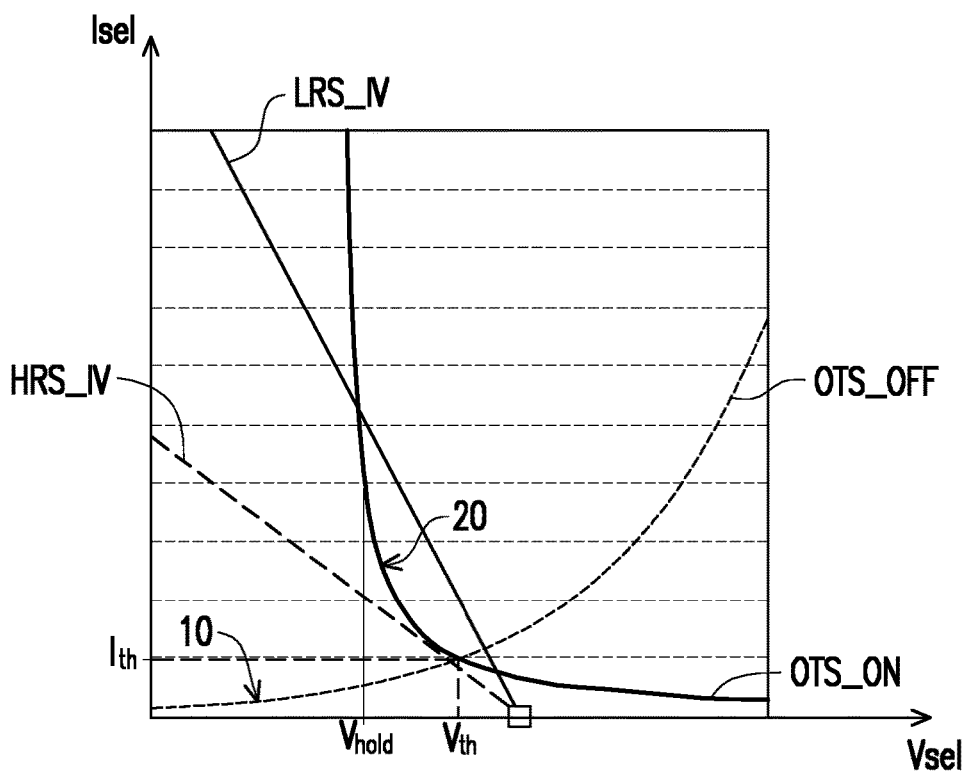
FIG. 4 illustrates IV characteristics of a memory cell in accordance with some embodiments.

FIG. 4 illustrates IV characteristics of a memory cell, i.e., memory cell 112 in FIG. 1, in accordance with some embodiments. The horizontal axis shown in FIG. 4 indicates a voltage across the selector element of the memory cell, and the vertical axis shown in FIG. 4 indicates a current flowing through the selector element of the memory cell. In FIG. 4, the characteristic curves OTS_ON and OTS_OFF indicate the IV characteristics of a conductive state and a nonconductive state of the selector element of the memory cell. The characteristic lines FIRS_IV and LRS_IV indicate the IV characteristics of a high-resistive state and a low-resistive state of the memory cell. In some embodiments, the characteristic curve OTS_ON of the selector element intersects with the characteristic line LRS_IV of the memory cell but does not intersect with the characteristic line HRS_IV of the memory cell.

In some embodiments, when the voltage Vsel across the selector element is less than the threshold voltage Vth, the selector element is in the nonconductive state, as indicated by the portion 10 of the curve OTS_OFF. The selector element remains at the nonconductive state until the voltage Vsel is greater than the threshold voltage Vth or the current Isel is greater than a threshold current Ith. In the nonconductive state, the resistance value of the selector element is relatively high, causing a small amount of current flowing through the selector element.

When the voltage Vsel greater than Vth or a current Isel greater than Ith is applied to the selector element, the selector element is turned on to be in the conductive state. When the selector element is in the conductive state, the selector element may drop or snapback to a holding voltage Vhold, as indicated by the portion 20 of the curve OTS_ON. In addition, when the selector element is in the conductive state, the voltage Vsel of the selector element remains close to the holding voltage Vhold as the current Isel of the selector element increases. The selector element may be remained in the conductive state until the current Isel of the selector element becomes less than a holding current (not shown) or the voltage Vsel becomes less than the holding voltage Vhold. In other words, the selector element may be returned to the nonconductive state when the voltage Vsel that is smaller than the holding voltage Vhold or the current Isel that is less than the holding current (not shown) is applied to the selector element.

Referring to FIG. 1 and FIG. 4, the selector element 1121 may include the OTS that has the negative-resistance property. The negative-resistance property may include an inverse proportion of the voltage Vsel across the OTS and the current Isel flowing through the OTS. The portion 20 of the curve OTS_ON indicates that the voltage across the selector element 1121 decreases or snap back as the current flowing through the selector element 1121 increases. In other words, the portion 20 of the curve OTS_ON may indicate the negative-resistance property of the selector element 1121.

In some embodiments, the selector element is configured to be turned on when the memory cell has the low-resistive state and to be turned off when the memory cell has the high-resistive state. As the selector element is turned off when the memory cell has the high-resistive state, and a higher resistance is induced resulting in an improvement for the read margin of a read operation performed on the memory cell. In some embodiments, an operating voltage (not shown) of the selector element is selected in a range from the holding voltage Vhold and the threshold voltage Vth. The operating voltage of the selector element is corresponded with an operating current (not shown) that may be determined based on the characteristic curve OTS_ON of the selector element. As aforementioned, the characteristic curve OTS_ON of the selector element does not intersect with the characteristic line HRS_IV. In some embodiments, the characteristic line HRS_IV is located below the characteristic curve OTS_ON of the selector element. As such, when a voltage is applied to the memory cell having the high-resistive state, the current flowing through the memory cell that is obtained based on the characteristic line HRS_IV is smaller than the operating current of the selector element. As a result, the selector element of the memory cell having the high-resistive state is kept at the nonconductive state, thereby inducing higher resistance value and further increasing the read margin of the read operation on the memory cell.

On the other hand, when the voltage is applied to the memory cell having the low-resistive state, the current flowing through the memory cell is greater than the operating current of the selector element. As a result, the selector element of the memory cell having the low-resistive state is turned on to be in the conductive state and allow the data stored in the memory cell being outputted to the bit line.

Figure 5:
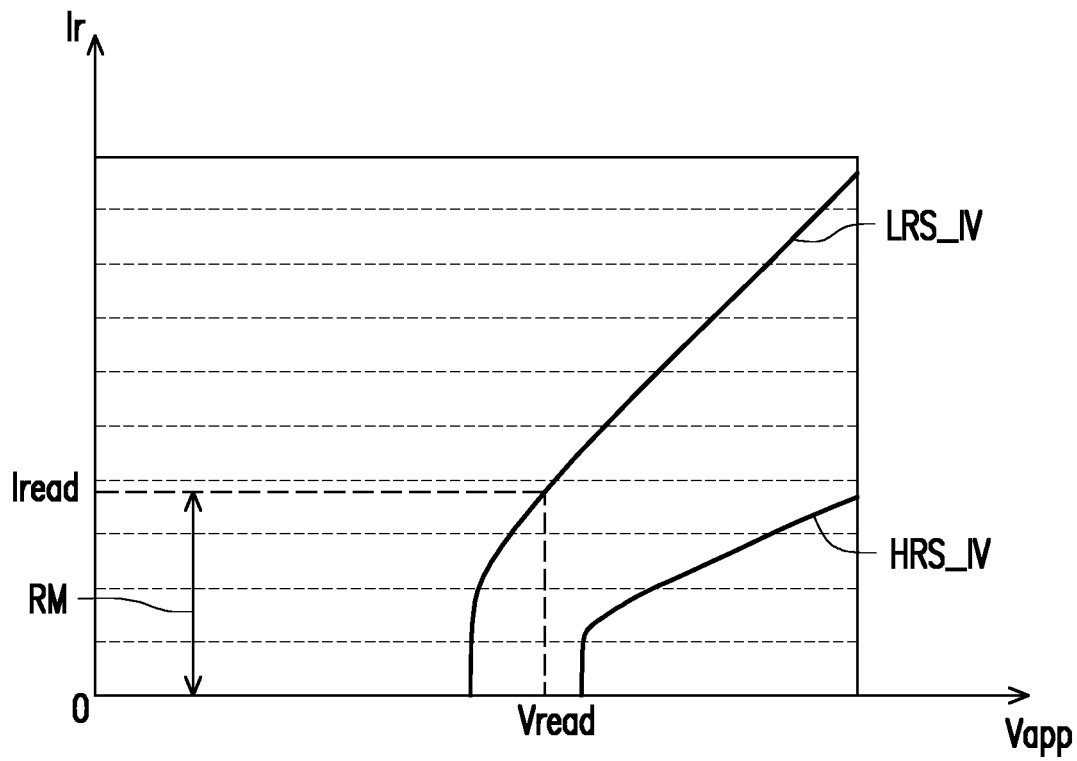
FIG. 5 illustrates IV characteristics of memory cell in a read operation in accordance with some embodiments.

FIG. 5 illustrates IV characteristics of a low-resistive state LRS_IV and a high-resistive state HRS of a memory cell, i.e., memory cell 112 in FIG. 1, in accordance with some embodiments. The horizontal axis illustrated in FIG. 5 indicates a voltage Vapp across the memory cell and the vertical axis illustrated in FIG. 5 indicates a current Ir flowing through the memory cell. A read operation may be performed to read the resistive state of the memory cell by applying a read voltage Vread to the memory cell and measuring the current Tread flowing through the memory cell. The value of the current Tread may be used to determine the resistive state of the memory cell.

Referring to FIG. 3 and FIG. 5, when the read voltage Vread is appropriated selected, the read margin RM of the read operation on the memory cell is improved. For example, when the memory cell is in the high-resistive state, the memory element of the memory cell is insulated from the bit line by the selector element. As shown in FIG. 5, the current flowing the memory cell having the high-resistive state is close to zero ampere. On the other hand, when the memory cell is in the low-resistive state, the selector element is turned on and the data stored in the memory cell is outputted to the bit line.

Figure 6:
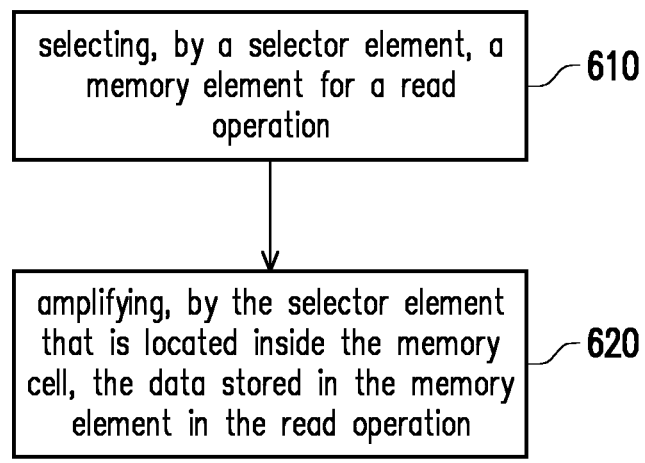
FIG. 6 illustrates a method of amplifying data stored in a memory cell using a selector element of the memory cell in accordance with some embodiments.

FIG. 6 illustrates a method of amplifying data stored in a memory element of a memory cell using a selector element of the memory cell in accordance with some embodiments. In step S610, a memory element for a read operation is selected by a selector element. The read operation is configured to read data stored in the memory element.

In some embodiments, the selector element may perform a switching function to select the memory element. The selector element may switch on to electrically connect the memory element of the memory cell to a bit line, thereby allowing the data stored in the memory element to be outputted to the bit line. The selector element may switch off the electrical connection between the memory element of the memory cell and the bit line, thereby insulating the memory element from the bit line.

In step 5620, data stored in the memory element is amplified by the selector element of the memory cell in the read operation. In other words, the data stored in the memory element of the memory cell may be amplified by a built-in amplifying function of the memory selector that is located inside the memory cell. In some embodiments, the material of the selector element includes a negative-resistance property that allow the selector element to have the amplifying function. The negative-resistance property may include an inverse proportion between the voltage applied to the selector element and the current flowing through the selector element.

In accordance with embodiments of the disclosure, a selector element of a memory cell in a memory array may have a switching function and an amplifying function, in which the switching function is configured to select a memory element of the memory cell in the read operation, and the amplifying function is configured to amplify the data stored in the memory element in the read operation. The amplifying function performed by the selector element of the memory cell may be considered as a built-in amplifying function that is configured to amplify the data stored in the memory cell before outputting the amplified data to the bit lines. The selector element may be configured to be in a conductive state when the memory cell is in the low-resistive state, and selector element may be configured to be in the nonconductive state when the memory cell is in the high-resistive state. In this way, a read margin of the read operation performed on the memory cell is further improved.

In some embodiments, a memory cell that includes a memory element and a selector element is introduced. The memory element is configured to store data of the memory cell. The selector element is coupled to the memory element in series and is configured to select the memory element for a read operation and amplify the data stored in the memory element in the read operation.

In some embodiments, a memory device that includes at least one memory cell is introduced. Each of the at least one memory cell is coupled to a bit line and a word line and includes a memory element and a selector element. The memory element is configured to store data of the memory cell. The selector element is coupled to the memory element in series and is configured to select the memory element for a read operation and amplify the data stored in the memory element in the read operation.

In some embodiments, a method of amplifying data stored in a memory element of a memory cell using a selector element of the memory cell is introduced. The method may include steps of selecting, by the selector element, the memory element for a read operation; and amplifying, by the selector element, the data stored in the memory element in the read operation. The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A memory cell, comprising:
   a memory element, configured to store data of the memory cell; and
   a selector element, coupled to the memory element in series, configured to select the memory element for a read operation and amplify the data stored in the memory element in the read operation, wherein the selector element is located inside the memory cell, wherein
   the memory cell includes a stack of a metal pad layer, a memory element layer and a selector element layer,
   the memory element layer is sandwiched between the metal pad layer and the selector element layer,
   the stack of the metal pad layer, the memory element layer and the selector element layer is sandwiched between a metal bit line layer and a metal word line layer, and
   the metal bit line layer directly contacts the metal pad layer,
   the selector element includes an ovonic threshold switch that has a threshold voltage and a holding voltage, and
   when the voltage in the range from the holding voltage to the threshold voltage is applied to the memory cell being in a second logic state, the current flowing through the memory element is less than the operating current of the selector element, and the selector element is in a non-conductive state.

2. The memory cell of claim 1, wherein a material of the selector element includes a negative resistance material that has a negative-resistance property, and the selector element is configured to amplify the data stored in the memory element based on the negative-resistance property.

3. The memory cell of claim 1, wherein
   when a voltage in a range from the holding voltage to the threshold voltage is applied to the memory cell being in a first logic state, a current flowing through the memory element is greater than an operating current of the selector element, and the selector element is in a conductive state.

4. The memory cell of claim 1, wherein
the negative-resistance property comprises an inverse proportion between a change of a voltage applied to the selector element and a change of a current flowing through the selector element.

5. The memory cell of claim 1, wherein
the selector element is configured to electrically connect the memory element to a bit line during the read operation when the memory element is in a first logic state, and
the selector element is configured to electrically insulate the memory element from the bit line during the read operation when the memory element is in a second logic state.

6. The memory cell of claim 4, wherein the memory element is a resistive memory element, the first logic state is a low-resistance state, and the second logic state is a high-resistance state.

7. The memory cell of claim 1, wherein the metal word line layer directly contacts the selector element layer.

8. The memory cell of claim 1, wherein
a material of the selector element layer includes a negative resistance material having at least one of a binary compound, a ternary compound, a quadruple compound and a quinary compound.

9. The memory cell of claim 8, wherein
the binary compound includes at least one of SiTe, GeTe, CTe, BTe, ZnTe, AlTe, GeSe, GeSb, SeSb, SiAs, GeAs, AsTe, and BC,
the ternary compound includes at least one of GeSeAs, GeSeSb, GeSbTe, GeSiAs, GeAsSb, SeSbTe, and SiTeSe, and
the quadruple compound includes at least one of GeSeAsTe, GeSeTeSi, GeSeTeAs, GeTeSiAs, GeSeAsSb, and GeSeSbSi.

10. A memory device, comprising:
at least one memory cell, wherein each of the at least one memory cell is coupled to a bit line and a word line, each of the at least one memory cell comprising:
a memory element, configured to store data of the at least one memory cell; and
a selector element, coupled to the memory element in series, configured to select the memory element for a read operation and amplify the data stored in the memory element in the read operation, wherein the selector element of a memory cell among the at least one memory cell is located inside the memory cell, wherein
the memory cell includes a stack of a metal pad layer, a memory element layer and a selector element layer,
the memory element layer is sandwiched between the metal pad layer and the selector element layer,
the stack of the metal pad layer, the memory element layer and the selector element layer is sandwiched between a metal bit line layer and a metal word line layer, and
the metal bit line layer directly contacts the metal pad layer,
the selector element includes an ovonic threshold switch that has a threshold voltage and a holding voltage, and
when the voltage in the range from the holding voltage to the threshold voltage is applied to the memory cell being in a second logic state, the current flowing through the memory element is less than the operating current of the selector element, and the selector element is in a non-conductive state.

11. The memory device of claim 10, wherein a material of the selector element includes a negative resistance material that has a negative-resistance property, and the selector element is configured to amplify the data stored in the memory element based on the negative-resistance property.

12. The memory device of claim 10, wherein
when a voltage in a range from the holding voltage to the threshold voltage is applied to the memory cell being in a first logic state, a current flowing through the memory element is greater than an operating current of the selector element, and the selector element is in a conductive state.

13. The memory device of claim 10, wherein
the selector element is configured to electrically connect the memory element to the bit line during the read operation when the memory element is in a first logic state,
the selector element is configured to electrically insulate the memory element from the bit line during the read operation when the memory element is in a second logic state, and
the memory element is a resistive memory element, the first logic state is a low-resistance state, and the second logic state is a high-resistance state.

14. The memory device of claim 13, further comprising:
a sense amplifier, coupled to the at least one memory cell, configured to amplify the data that is amplified by the selector element of the at least one memory cell to generate a read data.

15. The memory device of claim 10, wherein the metal word line layer directly contacts the selector element layer.

16. The memory device of claim 10, wherein
a material of the selector element layer includes a negative resistance material having at least one of a binary compound, a ternary compound, a quadruple compound and a quinary compound, and
the at least one of the binary compound, the ternary compound, the quadruple compound and the quinary compound is nitrogen (N)-doped, carbon (C)-doped or oxygen (O)-doped.

17. The memory device of claim 16, wherein the binary compound includes at least one of SiTe, GeTe, CTe, BTe, ZnTe,
AlTe, GeSe, GeSb, SeSb, SiAs, GeAs, AsTe, and BC,
the ternary compound includes at least one of GeSeAs, GeSeSb, GeSbTe, GeSiAs, GeAsSb, SeSbTe, and SiTeSe, and
the quadruple compound includes at least one of GeSeAsTe, GeSeTeSi, GeSeTeAs, GeTeSiAs, GeSeAsSb, and GeSeSbSi.

18. A method of amplifying data stored in a memory element of a memory cell using a selector element of the memory cell, wherein the selector element includes an ovonic threshold switch that has a threshold voltage and a holding voltage, the method comprising:
selecting, by the selector element, the memory element for a read operation; and
amplifying, by the selector element that is located inside the memory cell, the data stored in the memory element in the read operation, wherein
the memory cell includes a stack of a metal pad layer, a memory element layer and a selector element layer,
the memory element layer is sandwiched between the metal pad layer and the selector element layer,
the stack of the metal pad layer, the memory element layer and the selector element layer is sandwiched between a metal bit line layer and a metal word line layer, and
the metal bit line layer directly contacts the metal pad layer, the selector element includes an ovonic threshold switch that has a threshold voltage and a holding voltage, and when the voltage in the range from the holding voltage to the threshold voltage is applied to the memory cell being in a second logic state, the current flowing through the memory element is less than the operating current of the selector element, and the selector element is in a non-conductive state.

19. The method of claim 18, wherein selecting the memory element for the read operation and amplifying the data stored in the memory element in the read operation comprise:

electrically connecting the memory element to a bit line during the read operation when the memory element is in a first logic state, and electrically insulating the memory element from the bit line during the read operation when the memory element is in a second logic state.

20. The method of claim 18, wherein a material of the selector element layer includes a negative resistance material having at least one of a binary compound, a ternary compound, a quadruple compound and a quinary compound, the at least one of the binary compound, the ternary compound, the quadruple compound and the quinary compound is nitrogen (N)-doped, carbon (C)-doped or oxygen (O)-doped, the binary compound includes at least one of SiTe, GeTe, CTe, BTe, ZnTe, AlTe, GeSe, GeSb, SeSb, SiAs, GeAs, AsTe, and BC, the ternary compound includes at least one of GeSeAs, GeSeSb, GeSbTe, GeSiAs, GeAsSb, SeSbTe, and SiTeSe, and the quadruple compound includes at least one of GeSeAsTe, GeSeTeSi, GeSeTeAs, GeTeSiAs, GeSeAsSb, and GeSeSbSi.

* * * * *